United States Patent
Baude et al.

(10) Patent No.: US 7,298,084 B2
(45) Date of Patent: Nov. 20, 2007

(54) METHODS AND DISPLAYS UTILIZING INTEGRATED ZINC OXIDE ROW AND COLUMN DRIVERS IN CONJUNCTION WITH ORGANIC LIGHT EMITTING DIODES

(75) Inventors: Paul F. Baude, Maplewood, MN (US); Steven D. Theiss, Woodbury, MN (US); Michael A. Haase, St. Paul, MN (US); Eric W. Hemmesch, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 619 days.

(21) Appl. No.: 10/979,067

(22) Filed: Nov. 2, 2004

(65) Prior Publication Data

US 2006/0091793 A1    May 4, 2006

(51) Int. Cl.
*H01J 1/62* (2006.01)
*H01J 63/04* (2006.01)

(52) U.S. Cl. ............ 313/506; 313/500; 313/503; 313/504; 313/505; 313/512; 315/169.3; 315/169.4; 257/40; 257/79; 428/690; 345/30; 345/36; 345/44; 345/45

(58) Field of Classification Search ........ 313/495–512; 315/169.3–169.4; 257/40, 79; 428/690; 345/30, 36, 44, 45
See application file for complete search history.

(56) References Cited

U.S. PATENT DOCUMENTS

| | | | |
|---|---|---|---|
| 3,258,663 A | 6/1966 | Weimer | |
| 5,625,199 A | 4/1997 | Baumbach et al. | |
| 6,316,278 B1 * | 11/2001 | Jacobsen et al. | 438/22 |
| 6,563,174 B2 * | 5/2003 | Kawasaki et al. | 257/350 |
| 6,727,522 B1 | 4/2004 | Kawasaki et al. | |
| 6,844,673 B1 * | 1/2005 | Bernkopf | 313/506 |
| 7,189,992 B2 * | 3/2007 | Wager et al. | 257/43 |
| 2002/0056838 A1 | 5/2002 | Ogawa | |
| 2003/0047785 A1 | 3/2003 | Kawasaki et al. | |
| 2003/0150384 A1 | 8/2003 | Baude et al. | |
| 2003/0152691 A1 | 8/2003 | Baude et al. | |

(Continued)

FOREIGN PATENT DOCUMENTS

WO    WO 03/069015 A2    8/2003

(Continued)

OTHER PUBLICATIONS

Wager, J. F. et al, "Transparent Electronics and Prospects for Transparent Displays," Proceedings of the SPIE, Bellingham, VA, vol. 5080, No. 1, (2004) pp. 330-339.

(Continued)

*Primary Examiner*—Lisa Caputo
*Assistant Examiner*—Elmito Breval
(74) *Attorney, Agent, or Firm*—Jean A. Lown; John M. Bronk (57) ABSTRACT

Methods and displays utilize row and column drivers with ZnO channels that control pixel transistors with ZnO channels, which in turn address OLEDs of an array to produce images of a display screen. A display backplane including the ZnO row and column drivers and the OLEDs may be constructed by utilizing aperture masking or a combination of photolithography and aperture masking. Monolithic integration of the ZnO row and column drivers together with the ZnO pixel transistors is thereby achieved.

20 Claims, 4 Drawing Sheets

U.S. PATENT DOCUMENTS

| | | | |
|---|---|---|---|
| 2003/0218221 A1 | 11/2003 | Wagner, III et al. | |
| 2003/0218222 A1 | 11/2003 | Wagner, III et al. | |
| 2003/0231152 A1 | 12/2003 | Shin | |
| 2003/0234392 A1* | 12/2003 | Kung et al. | 257/13 |
| 2004/0108504 A1* | 6/2004 | Forbes et al. | 257/72 |
| 2004/0155846 A1* | 8/2004 | Hoffman et al. | 345/87 |

FOREIGN PATENT DOCUMENTS

| | | |
|---|---|---|
| WO | WO 2004/034449 A2 | 4/2004 |

OTHER PUBLICATIONS

Carcia, P.F., et al., "Transparent ZnO thin-film transistor fabricated by rf magnetron sputtering", Applied Physics Letter, American Institute of Physics, vol. 82, No. 7, pp. 1117-1119, Feb. 17, 2003.

El-Kareh, B. Fundamentals of Semiconductor Processing Technologies, Kluwer Academic Publishers, Chapter 4, pp. 169-260, Boston, 1995.

Fortunato, E.M., "Invisible Electronics: Thin Film Transistors based on Nanocrystalline ZnO".

Fortunato, E.M., et al., "Wide-bandgap high-mobility ZnO thin-film transistors produced at room temperature", Applied Physics Letters, American Institute of Physics, vol. 85, No. 13, pp. 2541-2543, Sep. 27, 2004.

Hattori, R. et al., Current-Writing Active-Matrix Circuit for Organic Light-Emitting Diode Display Using a Si:H Thin-Film-Transistors, IEICE Trans Electron, vol. E83-C, No. 5, pp. 779-782, 2000.

He, Y. et al., "Current-Source a-Si:H Thin-Film Transistor Circuit for Active-Matrix Organic Light-Emitting Displays", IEEE Elect. Dev. Letters, vol. 21, No. 12, pp. 590-592, Dec. 2000.

Hoffman R.L., et al., "ZnO-based transparent thin-film transistors", Applied Physics Letters, American Institute of Physics, vol. 82, No. 5, pp. 733-735, Feb. 3, 2003.

Hong, Y., et al., "Optoelectrical properties of four amorphous silicon thin-film transistors 200 dpi active-matrix organic polymer light-emitting display", Applied Physics Letter, American Institute of Physics, vol. 83, No. 16, pp. 3233-3235, Oct. 20, 2003.

Hossain F.M., et al., "Modeling and simulation of polycrystalline ZnO thin-film transistors", Journal of Applied Physics, American Institute of Physics, vol. 94, No. 12, pp. 7768-7777, Dec. 15, 2003.

Kobayashi S., et al., "Preparation of field effect transistor using nano-crystalline GaN", Journal of Non-Crystalline Solids, vol. 227-230, pp. 1245-1249, 1988.

Look D.C., "Recent advances in ZnO materials and devices", Materials Science and Engineering, B80, pp. 383-387, 2001.

Masuda S., et al., "Transparent thin film transistors using ZnO as an active channel layer and their electrical properties", Journal of Applied Physics, American Institute of Physics, vol. 93, No. 3, pp. 1624-1630, Feb. 1, 2003.

Nishii J., et al., "High Mobility Thin Film Transistors with Transparent ZnO Channels", Journal of Applied Physics, vol. 42, Part 2, No. 4A, pp. L347-L349, Apr. 1, 2003.

Norris, B.J., et al., "Spin-coated zinc oxide transparent transistors", Journal of Physics D: Applied Physics, vol. 36, pp. L105-L107, 2003.

Servati P., et al., "Amorphous silicon driver circuits for organic light-emitting diode displays", American Vacuum Society, Journal of Vacuum Scienc & Technology A: Vacuum, Surfaces, and Films, vol. 20, No. 4., pp. 1374-1378, Jul./Aug. 2002.

Tuzemen S., et al., "Production and properties of p-n junctions in reactively sputtered ZnO", Physica B, vol. 308-310, pp. 1197-1200, 2001.

Zhang D.H., et al., "Preparation of transparent conducting ZnO:Al films on polymer substrates by r.f. magnetron sputtering", Applied Surface Science, vol. 158, pp. 43-48, 2000.

* cited by examiner

METHODS AND DISPLAYS UTILIZING INTEGRATED ZINC OXIDE ROW AND COLUMN DRIVERS IN CONJUNCTION WITH ORGANIC LIGHT EMITTING DIODES

TECHNICAL FIELD

The present invention is related to displays including the circuitry included on display backplanes. More particularly, the present invention is related to backplanes of displays where row and column drivers are included in the circuitry of the backplane to control pixel transistors and where organic light emitting diodes are included in the circuitry as the pixel elements that are activated by the pixel transistors.

BACKGROUND

Display backplanes are an important component in a display device, such as a liquid crystal display (LCD), organic light emitting diode (OLED) display, or other display technology. Display backplanes include a substrate providing a platform upon which circuitry is created to cause a display screen to display images. Typically, the backplane includes an array of pixel transistors that provide an electrical signal to an array of pixel elements, such as OLED cells, to cause the picture elements or pixels to produce light that results in the image to be viewed. Additional circuitry includes row and column drivers and is typically located separately from the backplane. The row and column drivers decode the incoming video data to individually activate the pixel transistors and thereby individually control the pixels.

Because the pixel transistors in the typical case are located on the backplane itself, the pixel transistors are formed as thin film transistors (TFFs) and thereby allow for a very thin display screen such as for thin screen computer and television monitors, telephones, and other compact devices. Because the row and column drivers in the typical case are not located on the backplane, they are not necessarily TFIs. However, the row and column drivers occupy separate space, such as on an integrated circuit chip installed on a display circuit board.

The interconnections between the row and column drivers and the backplane array can be complex. As the number of rows and columns increase, the interconnect density increases. Even when the row and column drivers are silicon chips bonded to the glass, the level of interconnect complexity can become prohibitive.

It is desirable in some display screen applications to eliminate or dedicate for other purposes the space required for the row and column driver chip and/or to bring the row and column drivers into closer proximity with the pixel transistors. Therefore, it is desirable to move the row and column drivers directly onto the backplane along with the pixel transistors. However, the row and column drivers must have very fast switching capabilities whereby conventional TFT construction utilizing low mobility semiconductor channels such as amorphous silicon becomes problematic.

It is advantageous, particularly for an OLED based display, to have TFTs including a semiconductor with as large an electron mobility as possible. In general, the electron mobility directly affects transistor speed and/or transistor size. Semiconductors like amorphous silicon have field effect mobilities on the order of 0.5 $cm^2$/V-sec. Materials such as polysilicon have higher mobilities (greater than 20 $cm^2$/V-sec) but require higher processing temperatures and more complex fabrication procedures.

SUMMARY

Embodiments of the present invention address these issues and others by providing displays and methods that utilize row and column drivers and pixel transistors that are monolithically integrated (i.e., patterned concurrently and by substantially the same process) onto a display substrate while also employing OLEDs as the front-plane elements. The row and column drivers as well as the pixel transistors are constructed as TFTs that have zinc oxide (ZnO) channels, which have a sufficiently high mobility to achieve the switching speeds necessary to properly decode the display signals and activate the OLED pixels. The ZnO row and column drivers address the ZnO pixel transistors that activate the OLEDs of an array to form images on the display screen. The TFTs may be patterned through a process involving aperture masks such as repositionable polymeric aperture masks. Alternatively, the TFFs may be patterned through photolithography.

One embodiment is a display that includes a backplane substrate. A set of thin film transistor row and column drivers that contains ZnO channels is patterned on the backplane substrate. Additionally, a set of pixel thin film transistors that contain ZnO channels is monolithically integrated with the set of thin film transistor row and column drivers on the backplane substrate. A set of organic light-emitting diodes is patterned on the backplane substrate. Each organic light-emitting diode, which includes a stack of layers, is activated to produce light by a corresponding one or more pixel thin film transistors of the set, and the corresponding one or more pixel thin film transistors are addressed by the set of thin film transistor row and column drivers.

Another embodiment is a method of creating a display. The method involves patterning a set of ZnO channel thin film transistor row and column drivers on a backplane substrate. The method further involves patterning a set of ZnO channel pixel thin film transistors on the backplane substrate such that the pixel thin film transistors are in electrical connection with the thin film row and column drivers. The method also involves patterning a set of organic light emitting diodes in electrical connection with the pixel thin film transistors. Each organic light emitting diode includes a stack of layers.

Another embodiment is a method of creating a video display backplane. This method involves utilizing polymeric aperture masking to define ZnO channel row and column drivers and ZnO channel pixel thin film transistors on a backplane substrate. This method further involves utilizing polymeric aperture masking to define organic light-emitting diodes on the backplane substrate.

DETAILED DESCRIPTIONS

Embodiments of the present invention provide display backplanes having the combination of ZnO row and column drivers integrated onto the same substrate as ZnO pixel transistors and OLEDs. These embodiments provide the superior viewing characteristics of OLEDs with the compactness of integrated row and column drivers. Furthermore, certain embodiments provide for the construction of the backplane utilizing polymeric aperture masking to pattern the ZnO row and column drivers, the ZnO pixel transistors, and the OLEDs. Certain of these embodiments provide for the efficient use of a polymeric aperture masking process resulting in a high yield for the backplane construction while benefiting from the superiority of OLEDs with a reduced likelihood of OLED damage during manufacture.

Various techniques known in the art may be utilized to pattern the transistors. For example, in some embodiments, photolithography may be utilized to pattern the TFTs followed by utilizing an aperture mask to pattern OLED layers. In other embodiments, wet chemical processing may be avoided altogether as aperture masks may be utilized to pattern the OLED stack as well as the TFTs used as the row and column drivers and the pixel TFTs.

Figure 1:
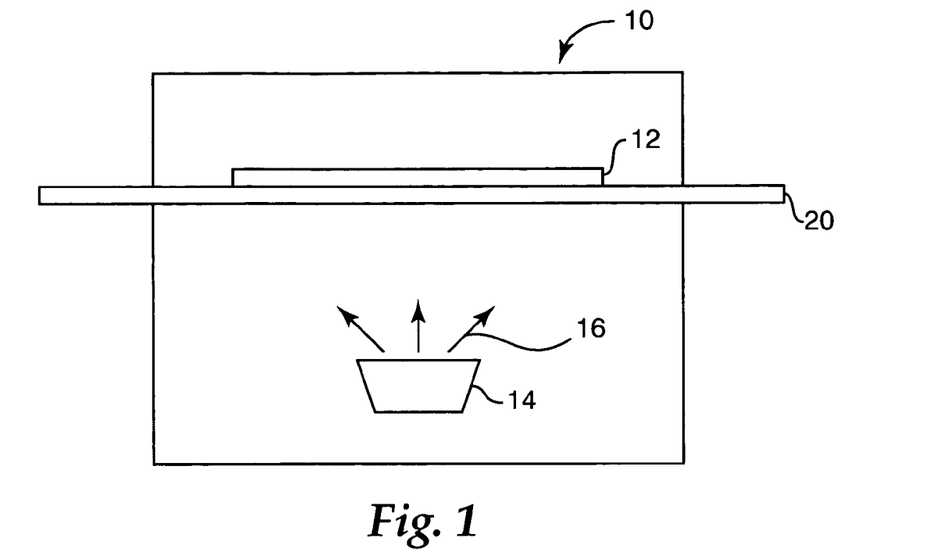
FIG. 1 illustrates an aperture masking process that may be utilized to construct the ZnO row and column drivers, ZnO pixel transistors, and OLEDs atop a common substrate.

As noted, in certain embodiments of the present invention, the transistors can be prepared using an aperture mask, such as a shadow mask. Illustrative procedures utilizing aperture masks are set forth in U.S. patent applications Ser. Nos. 2003/152691 and US2003/0150384, incorporated herein by reference. To further illustrate the aperture masking process, FIG. 1 is a simplified block diagram of a deposition station that can use an aperture mask for patterning the OLED stack as well as the TFT row and column drivers and pixel TFTs. In particular, deposition station 10 can be constructed to perform a vapor deposition process in which material is vaporized and deposited on a deposition substrate through an aperture mask. The deposited material may be any material necessary for the OLED layers or TFT layers including semiconductor material, dielectric material, or conductive material used to form a variety of elements. For example, organic or inorganic materials may be deposited. In some cases, both organic and inorganic materials can be deposited.

An aperture mask 20, formed with aperture mask patterns passes through deposition station 10 such that the aperture mask can be placed in proximity with a display backplane substrate 12. Backplane substrate 12 may comprise any of a variety of materials depending on the desired display circuit to be created. For example, backplane substrate 12 may comprise a flexible material or alternatively a rigid material. Any backplane substrates such as glass substrates, silicon substrates, rigid plastic substrates, metal foils coated with an insulating layer, or the like, could also be used. In any case, the backplane substrate 12 may or may not include previously formed features, such as where the TFTs are first patterned onto the backplane substrate 12 using photolithography and at least one layer of the OLEDs are subsequently patterned using the aperture mask. In some examples, all layers of the OLEDs are patterned using the aperture mask.

Deposition station 10 is typically a vacuum chamber. After a pattern in aperture mask 20 is secured in proximity to backplane substrate 12, material 16 is vaporized by deposition unit 14. For example, deposition unit 14 may include a boat of material that is heated to vaporize the material. The vaporized material 16 deposits on backplane substrate 12 through the deposition apertures of aperture mask 20 to define at least a portion of a circuit layer on backplane substrate 12. Upon deposition, material 16 forms a deposition pattern defined by the pattern in aperture mask 20. Aperture mask 20 may include apertures and gaps that are sufficiently small to facilitate the creation of small circuit elements using the deposition process as described above. Additionally, the pattern of deposition apertures in aperture mask 20 may have a large dimension as mentioned above. Other suitable deposition techniques include e-beam evaporation, various forms of sputtering, and pulsed laser deposition. Example 1, referenced below in relation to FIGS. 2 and 3, includes details for one illustrative method of patterning the TFTs and OLEDs by utilizing aperture masks.

Figure 2:
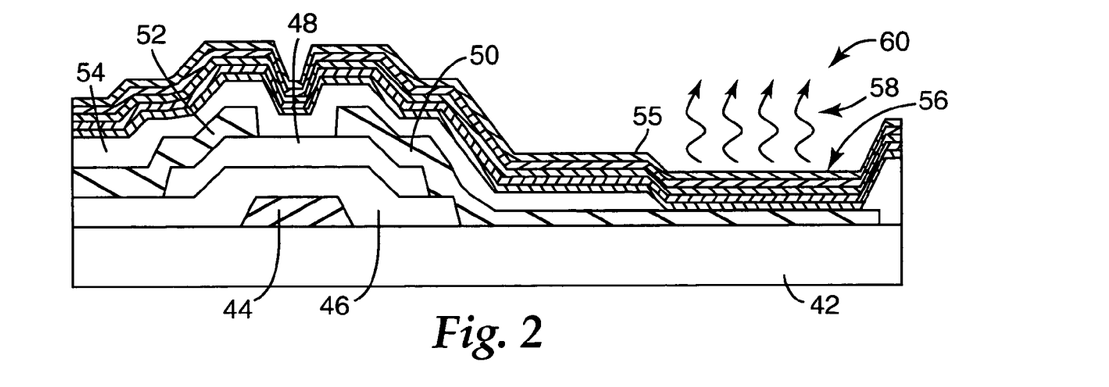
FIG. 2 illustrates a cross-sectional view of one example of a substrate having a ZnO TFT pixel transistor driving a top emitting OLED stack, which emits light away from the substrate.
Figure 3:
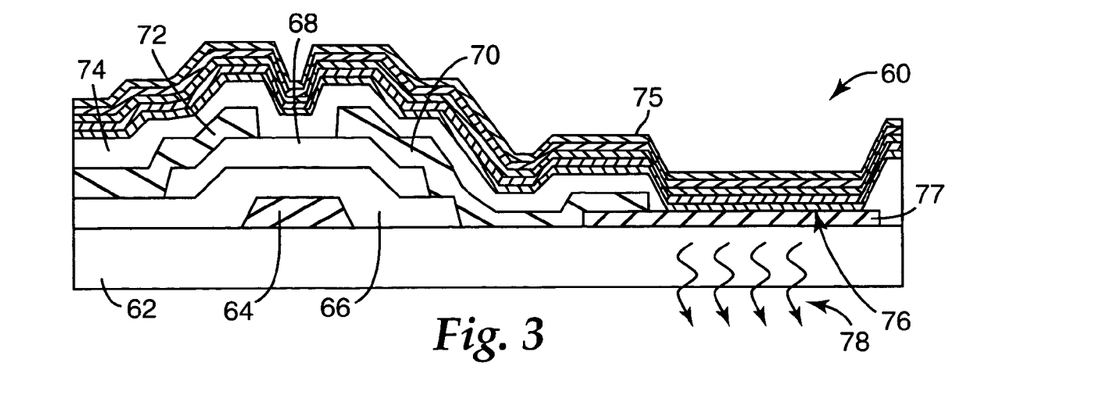
FIG. 3 illustrates a cross-sectional view of another example of a substrate having a ZnO TFT pixel transistor driving a bottom emitting OLED stack, which emits light through the substrate.

Thus, utilizing an aperture mask as discussed above is one manner for depositing the TFTs making up the row and column drivers and the pixel TFTs of the display backplane. Furthermore, an aperture mask as discussed above is also one manner for patterning one or more of the layers of the OLEDs that are also present on the substrate adjacent to the pixel TFT. A cross-section of the OLED deposited adjacent the pixel TFT for activating the OLED is shown in the examples of FIGS. 2 and 3. In some devices, all layers of the OLED stack are patterned using an aperture mask.

It can be beneficial to utilize a polymeric aperture mask, constructed from materials such as polyimide. Advantages of using polymeric aperture masks for patterning the OLED stack include potentially less damage to the OLED material by the aperture mask and the ability to stretch the aperture mask to mitigate dimensional changes in the mask due to various causes such as thermal expansion.

As an alternative to aperture mask procedures, the ZnO based TFT circuitry may be produced by photolithography while the OLEDs are separately deposited via an aperture mask procedure discussed above. Well-known photolithography techniques may be utilized for defining the ZnO pixel circuitry. Examples of such photolithography techniques are disclosed in Badih El-Kareh, Fundamentals of Semiconductor Processing Technologies, Kluwer Academic Publishers, Chapter 4, pages 590-592, Boston, (1995). Additionally, Example 2, referenced below with respect to FIGS. 2 and 3, includes details for an illustrative process of applying photolithography to first pattern the TFTs followed by application of a shadow mask to pattern the OLED stack. Accordingly, the aperture mask process of FIG. 1 is provided for purposes of illustration and is not intended to be limiting as to the manner for patterning the TFTs of the display.

The example of FIG. 2 shows the deposition of the pixel TFT and OLED atop a common substrate 42. In this example, the OLED is top emitting (i.e., emits away from rather than through the substrate). As noted above with reference to FIG. 1, the substrate 42 may be constructed of various materials such as glass and other rigid materials or may be made flexible through the use of materials such as metal foil, and plastic (e.g., polyimide, PEN). A gate electrode 44, constructed of materials such as titanium and gold, is directly patterned onto the substrate 42 and then a gate dielectric 46 such as $SiO_2$ or $Al_2O_3$ is patterned atop the gate electrode 44 to entirely isolate the gate electrode 44 from the semiconductor channel 48. The semiconductor channel 48 is a layer of ZnO that is patterned atop the gate dielectric 46.

A drain electrode 52, constructed of materials such as aluminum, is patterned on one side of the channel 48 while a separate source electrode 50 is patterned on the other side of the channel 48 and may be constructed of the same material as the drain electrode 52. The source electrode 50 extends onto the substrate 42 and is positioned between the substrate 42 and the OLED stack 56. An encapsulant layer 54, constructed of materials such as a photoimageable epoxy or other material such as $SiO_2$, is patterned over the layers of the TFT including the source/drain electrodes 50, 52 and the channel 48 while leaving a void above the area of the source electrode 50 where the OLED stack 56 is patterned. It should be noted that the use of the terms source and drain are somewhat arbitrary as it will be appreciated that the electrode contacting the OLED stack 56 may be either the source or the drain, depending upon the circuit design that is chosen.

Typically, the source electrode and drain electrode features are patterned such that a channel length of about 1 micrometer to about 50 micrometers (preferably about 5 micrometers to about 20 micrometers) separates them. For photolithographically patterned TFTs, the gate length may be as small as 1 micrometer, with 5 micrometers being typical. For aperture mask patterned TFTs, the gate length is more likely to be 5 to 60 micrometers with a typical gate length of 20 to 30 micrometers.

The steps of one illustrative process for patterning the layers of the TFTs, including the pixel TFT of FIG. 2, are set forth in detail in Example 1 where the TFTs are patterned by use of an aperture mask. Likewise, the steps of another illustrative process for patterning the layers of the TFTs including the pixel TFT of FIG. 2 are set forth in detail in Example 2 where the TFTs are patterned by photolithography. In either case, the TFTs may be patterned at the substantially same time and through substantially the same process such that the TFT row and column drivers and the pixel TFTs are monolithically integrated onto the display substrate 42.

The OLED stack 56 is constructed of a stack of organic materials. These materials and their particular order within the stack 56 for one illustrative example are set forth in Examples 1 and 2. To complete a path for current through the OLED stack 56, a top electrode 55 is patterned over the top of the OLED stack 56. This top electrode 55 is constructed of a transparent material such as indium tin oxide (ITO) or a thin metal layer so that the light may be emitted through the electrode 55. Upon receiving electrical current, the materials of the OLED stack 56 begin to emit light.

In operation of the configuration of FIG. 2, voltage is applied to the drain electrode 52. However, very little current is passed to the source electrode 50 unless voltage is also applied to the gate electrode 44 as the channel 48 remains in a non-conductive state. Upon application of voltage to the gate electrode 44, the channel 48 becomes conductive and current flows through the channel to the source electrode 50 and through the OLED stack 56, thereby causing the OLED to emit light 58 away from the substrate 42. Accordingly, an array of OLEDs addressed in this manner results in an image being displayed.

The example of FIG. 3 shows the deposition of the pixel TFT and OLED atop a common transparent substrate 62, constructed of materials such as glass or a transparent plastic where the OLED is bottom emitting (i.e., emits light through the substrate). A gate electrode 64 is directly patterned onto the substrate 62 and then a gate dielectric 66 is patterned atop the gate electrode 64 to entirely isolate the gate electrode 64 from the semiconductor channel 68. The semiconductor channel 68 again is a layer of ZnO that is patterned atop the gate dielectric 66. A drain electrode 72 is patterned on one side of the channel 68 while a separate source electrode 70 is patterned on the other side of the channel 68. The source electrode 70 makes contact with a transparent OLED electrode 77, such as an ITO electrode, so that the OLED may emit light through the electrode 77 and substrate 62. An encapsulant layer 74, again constructed of materials such as a photoimageable epoxy or other material such as $SiO_2$, is patterned over the layers of the TFT including the source/drain electrodes 70, 72 and the channel 68 while leaving a void above the area of the transparent electrode 77 where the OLED stack 76 is patterned. A top electrode 75 is deposited atop the OLED stack 76.

In operation, voltage is applied to drain electrode 72. However, little current is passed to the source electrode 70 unless voltage is also applied to the gate electrode 64 as the channel 68 remains in a non-conductive state. Upon application of voltage to the gate electrode 64, the channel 68 becomes conductive and current flows through the channel to the source electrode 70 and through the OLED stack 76, thereby causing the OLED to emit light 78 through the electrode 77 and substrate 62. A matrix of OLEDs addressed in this manner results in an image being displayed.

While not specifically discussed above, it will be appreciated that the OLED may be protected from exposure to ambient elements by including an encapsulant that encloses the OLED stack of FIGS. 2 and 3. The encapsulants of FIGS. 2 and 3 then further encapsulate the TFTs and the OLED stack.

Figure 4:
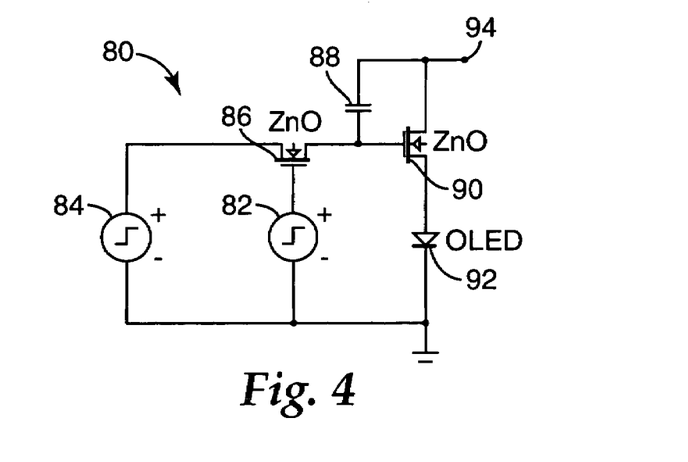
FIG. 4 is an illustrative example of one cell of ZnO pixel transistors and OLED circuitry forming a single pixel of a display.

FIG. 4 is an illustrative example of circuitry 80 of a single light-emitting cell where two ZnO pixel TFTs are used. A first voltage source 82 provides enable pulses on a periodic basis to gate a ZnO pixel TFT 86. ZnO pixel TFT 86, once switched on, charges capacitor 88 and the gate of ZnO pixel TFT 90 based on the data pulse from a second voltage source 84. Charging the gate of ZnO pixel TFT 90 switches ZnO pixel TFT 90 to a conductive state, thereby allowing current to flow through the OLED 92 from a supply voltage 94 which produces light for forming an image. The first voltage source 82 that is providing enable pulses represents the output from row driver circuitry discussed below in relation to FIGS. 7-9, while the second voltage source 84 that is providing data pulses represents the output from column driver circuitry also discussed below in relation to FIGS. 7-9.

Figure 5:
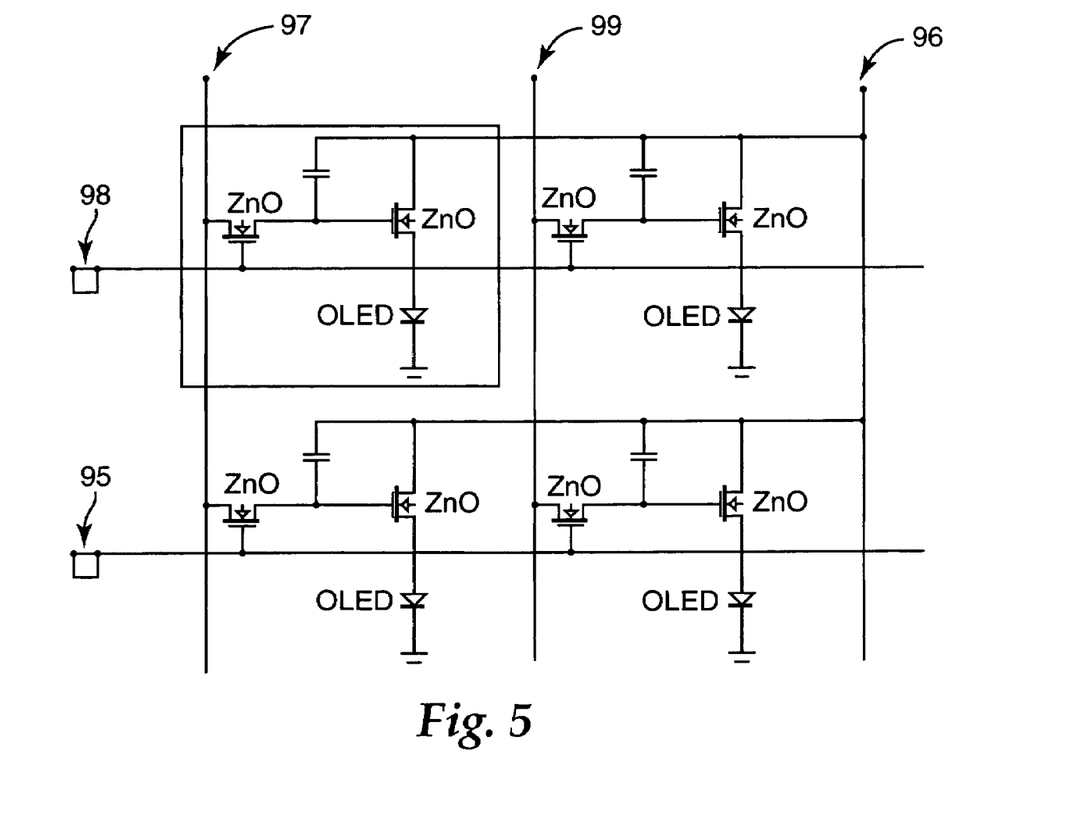
FIG. 5 is an illustrative example of an array of cells of ZnO pixel transistors and OLED circuitry forming an array of pixels of a display.

FIG. 5 is an exemplary circuit diagram of an array of light-emitting cells based on the configuration shown in FIG. 4. Four cells are shown for purposes of illustration, and there are two ZnO pixel TFTs per cell in this example. One ZnO pixel TFT of each cell is driven by an enable pulse from output 95, 98 of ZnO TFT based row driver circuitry while each OLED of each cell is further driven by a data pulse from output 97, 99 of ZnO TFT based column driver circuitry to provide power to each OLED from the voltage source 96. Accordingly, the arrays of OLEDs produce images as a result of the decoding by the row and column driver outputs activating the individual OLEDs.

Figure 6:
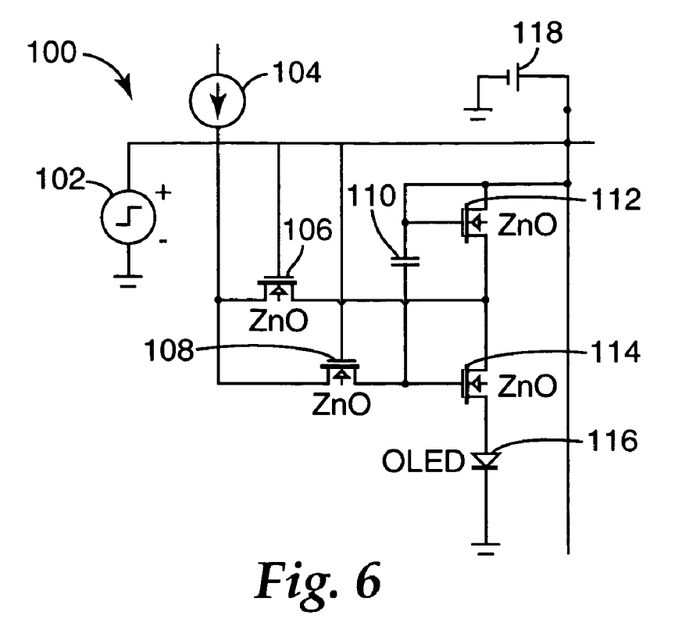
FIG. 6 is an illustrative example of one cell of ZnO pixel transistors and OLED circuitry forming a single pixel of a display.

FIG. 6 is an exemplary circuit diagram that illustrates one alternative light-emitting cell design that is based on ZnO pixel TFTs and that mitigates variation in ZnO TFT parameter variation that might otherwise compromise OLED performance. The generalized circuits of FIGS. 4 and 6, excluding the ZnO aspects of the transistors, are known in the art. Specifically, a circuit layout like that of FIG. 6 is shown and described by Yi He et al, EEEE Electron Device Letters, Vol. 21(12), 590-592 (2000).

In this circuit of FIG. 6, ZnO transistors 106 and 108 are switched on with a signal from voltage source 102. Current source 104 provides the data during this time and forces ZnO transistor 114 to pass the current from current source 104, while charging storage capacitor 110 to the voltage level necessary to drive ZnO transistor 114 at the desired current level. During this time current will not flow through ZnO transistor 112 if power source 118 is at a lower voltage than the drain electrode of ZnO transistor 114. This process accommodates transistor threshold voltage shifts that may occur over time. Current through ZnO pixel transistor 114 then activates OLED 116 to emit light. When the select signal from power source 102 is turned off, ZnO transistors 106 and 108 are turned off, but current now sourced by voltage source 118 continues to flow though ZnO transistor 114 and OLED 116 as long as storage capacitor 110 remains charged. The cell of FIG. 6 may also be extended to produce an array of cells similar that shown in FIG. 5.

Figure 7:
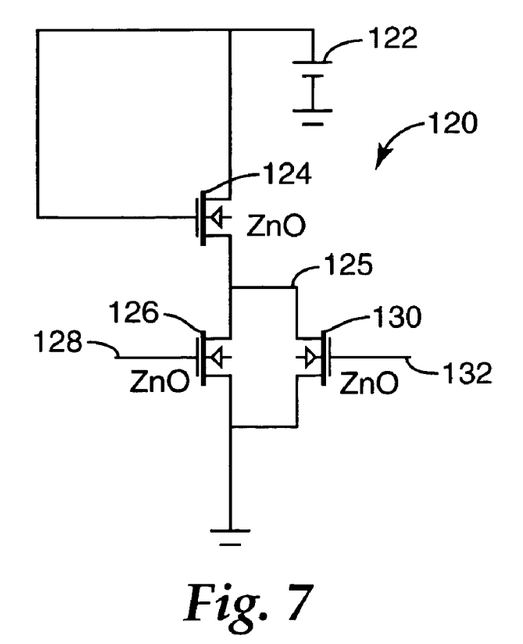
FIG. 7 is an illustrative example of a ZnO TFT based digital logic gate that is used to create row and column driver circuitry that interfaces with arrays of cells such as shown in FIG. 5 that are based on the circuitry of either FIG. 4 or 6.

FIG. 7 is an exemplary circuit diagram that illustrates ZnO TFT based digital logic gates that may be used as the building blocks of row and column driver circuitry which produces the enable and data pulses discussed above in relation to FIGS. 4-6. The particular logic gate of FIG. 7 is an example of a "NOT OR" (NOR) gate 120. However, it will be appreciated that other logic gate designs formed of ZnO TFTs may be utilized as the building blocks of the row and column driver circuitry, such as OR, AND, "EXCLUSIVE OR" (XOR) logic gates. In this example, a first ZnO TFT 124 receives power from a voltage source 122. TFT 124 remains in a conductive state and an output 125 is taken from the source of the TFT 124. However, the output 125 is also connected to the drain of ZnO TFT 126 and ZnO TFT 130. If a logic high is provided at either gate 128 of TFT 126 or gate 132 of TFT 130, then the output 125 is pulled to a logic low.

In embodiments of the present invention, these logic gates 120 are formed by the ZnO based TFTs 124, 126, 130 being patterned on the backplane substrate in the electrical configurations shown along with the ZnO based pixel TFTs and OLEDs. The ZnO TFTs of the logic gates may be monolithically integrated with the ZnO based pixel TFTs on the backplane substrate of a display, either by the aforementioned processes of aperture mask based patterning or photolithography based patterning. The patterning of electrical connections of the ZnO based logic gates forming the row and column driver circuitry will become apparent with reference to FIGS. 8 and 9, discussed below.

Figure 8:
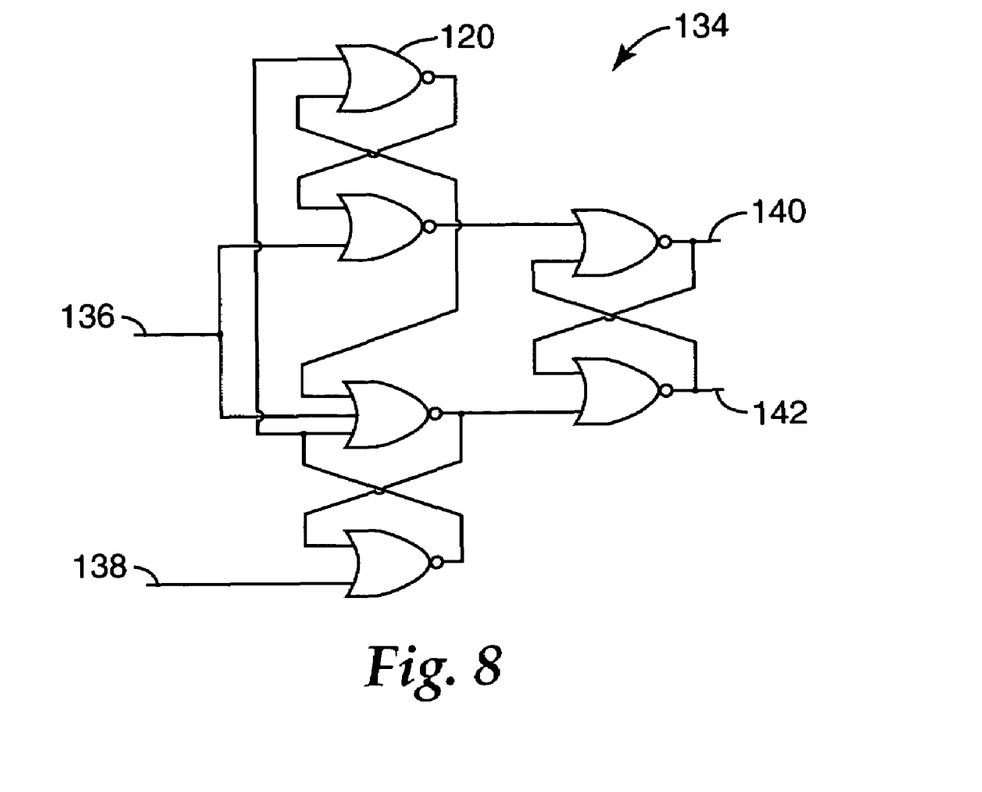
FIG. 8 is an illustrative example of a digital logic flip-flop that is formed by ZnO TFT based digital logic gates such as those of FIG. 7 to create the row and column driver circuitry.

FIG. 8 illustrates a standard flip-flop 134, but this flip-flop is formed by a set of interconnected NOR gates 120 that are formed of ZnO based TFTs as shown in FIG. 7 that are monolithically integrated with the ZnO pixel TFTs on the backplane substrate of the display. A clock input 136 is provided as is a data input 138. The flip-flop 134 provides an output 140 and an inverted output 142. It will be appreciated that other logic devices besides flip-flops may be utilized when constructing row and column driver circuits.

Figure 9:
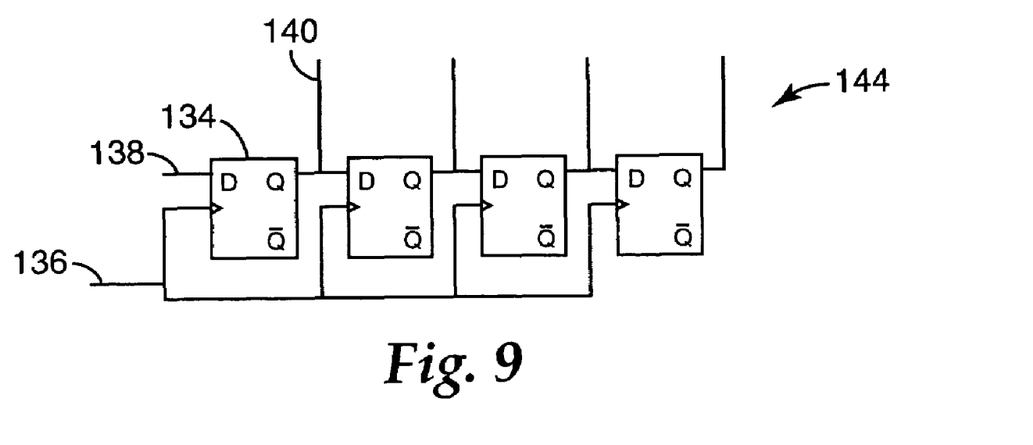
FIG. 9 is an illustrative example of a digital logic shift register that is formed by ZnO TFT based digital logic flip-flops such as those of FIG. 8 to provide a row or column driver circuit.

FIG. 9 illustrates a standard shift register 144, but this shift register is formed of cascaded flip-flops 134 as shown in FIG. 8, which are constructed from the logic gates including the ZnO based TFTs patterned on the backplane substrate. The clock 136 and data signals 138 are provided serially from the video data bus of the device producing the display data. In this example, the shift register 144 receives the data bits for the columns of the array of pixels serially but must de-multiplex the serial data by converting the serial data into parallel data. Parallel data allows each pixel to receive its controlling bit or bits simultaneously, as opposed to sequentially. The clock signal 136 propagates the bits down the cascaded flip-flops until the data bit is being provided from the output 140 that corresponds to the proper column of the display. In the simple example shown, the first data bit in is intended for the fourth column so the first data bit has reached its destination column by the fourth clock pulse.

During the propagation, a row driver circuit, which may also be a logic device such as a set of shift registers, maintains a logic low output for each row line until the data bits are located at the appropriate column output 140 of the column shift register 144. This timing is based on the number of clock pulses since the last logic high output of the row driver circuit. This prevents the gating transistor, such as transistor 86 of FIG. 4, from passing the incorrect bit to the gate of the pixel transistor directly connected to the OLED. Once the bits are properly aligned with the respective columns, the row driver circuit provides a logic high output to allow the ZnO pixel TFTs gating each output 140 to become conductive. In doing so, the bit for each column is passed to the gate of the ZnO pixel TFT directly connected to the OLED thereby causing the OLED to either emit light or not, depending upon the value of the bit.

While FIGS. 7-9 provide one example of row and column circuitry, it will be appreciated that there may be many variations of row and column circuitry that are constructed of ZnO based TFTs patterned on the display substrate. Accordingly, FIGS. 7-9 are provided only to illustrate one example of such row and column circuitry.

Examples 1 and 2 immediately follow and set forth details of patterning the ZnO TFTs and OLEDs on the display substrate. The details of Examples 1 and 2 are each provided only to illustrate separate examples of patterning the ZnO TFTs and OLEDs. It will be appreciated that there may be many variations in both the aperture mask fabrication process and the alternative mixed photolithography-aperture mask fabrication process.

EXAMPLES

Example 1

ZnO TFT and OLED Shadow Mask Fabrication Description for a Display Integrated circuits are comprised of circuit elements, such as thin film transistors (TFTs) and capacitors, which are formed by vacuum depositing thin films through flexible masks which act to pattern the films. Typical thin film materials are metals for conductors or electrodes, dielectrics for capacitors or to prevent electrical conduction between intersecting metal lines, and semiconductors for the active layer of transistors. Examples of thin film materials are gold, titanium, and aluminum for conductors or electrodes; $Al_2O_3$ or $SiO_2$ for dielectrics; and sputtered ZnO or thermally evaporated pentacene as semiconductors.

A 2"×2" glass slide was cleaned by rinsing with alcohol. Polymeric shadow masks were formed as previously described in applicant's publications, U.S. patent applications Ser. No. 2003/0152691 and 2003/0150384, incorporated herein by reference. Apertures were formed in the shadow masks using laser ablation.

A gate level shadow mask pattern was centered on the glass substrate. 100 Å of e-beamed titanium was deposited in a vacuum chamber on the glass substrate through the shadow mask followed by 750 Å of evaporated gold from a resistive-heater source. The substrate and the shadow mask were removed from the vacuum system. The substrate was cleaned by blowing nitrogen over its surface.

The gate dielectric was deposited as follows. A shadow mask with apertures for the gate dielectric pattern was aligned and registered with the gate level deposition patterns on the substrate. 1600 Å $SiO_2$ was deposited through the shadow mask in a vacuum chamber (450 W). The substrate and the shadow mask were removed from the vacuum system and the substrate was cleaned with a nitrogen blow.

The ZnO semiconductor was deposited as follows. A shadow mask with apertures for the semiconductor pattern was aligned and registered with the gate dielectric and gate level deposition patterns on the substrate. 500 Å ZnO was deposited in a vacuum chamber (100 W from a 6 inch diameter ZnO target, 10% $O_2$ in Ar flow at 0.4 sccm.). The substrate and the shadow mask were removed from the vacuum system and the substrate was cleaned with a nitrogen blow.

The source and drain electrodes (Al) were similarly deposited through appropriate shadow masksby vacuum evaporation from a resistive-heater source. At this point the integrated TFT circuitry was complete.

An encapsulant was deposited on top of the integrated TFT in order to separate the OLED layers from layers of the TFT and integrated circuit. The encapsulant was deposited by aligning an encapsulant shadow mask with the previously patterned layers. Electron beam evaporated $Al_2O_3$ was used as the encapsulant. It was deposited by vacuum deposition to a thickness of 3000 Å.

The OLED stack may then be deposited on top of the encapsulating layer by vacuum evaporating 3000 Å 4,4',4"-tris(N-(3-methylphenyl)-N-phenylamine)triphenylamine (MTDATA) doped with 3% fluorinated tetracyanoquinodimethane (TCNQ), followed by 400 Å N,N'-Bis(naphthalen-1-yl)-N,N'-bis(phenyl)benzidine (NPB), 300 Å tris-(8-hydroxyquinoline) aluminum ($Alq_3$) doped with 10-(2-benzothiazolyl)-1,1,7,7- tetramethyl-2,3,6,7-tetrahydro-1H, 5H,11H benzopyrano (6,7,8-ij) quinolizin-11-one (C545T), 200 l $Alq_3$, 7 Å LiF (deposited at a rate of 0.5 Å/sec), 50 Å Al, and finally 150 Å Ag.

Example 2

ZnO TFT Photolithography/OLED Shadow Mask Fabrication Description for a Display

A 2"×2" glass slide was cleaned using an alcohol rinse. The slide was prebaked at 120° C. for 60 sec. to improve photoresist (PR) adhesion. A negative photoresist (FUTURREX NR7-1000PY, available from Futurrex, Inc, Franklin, N.J.) was applied to the slide by spin coating (5000 RPM spin for 60 seconds, followed by a soft back at 150° C. for 60 seconds). The photoresist was exposed to a gate level mask with 180 mJ/cm² and then post exposure baked at 100° C. for 60 seconds. The slide with exposed photoresist was developed using FUTURREX RD6 developer for about 10 seconds. The developed slide was inspected and then rinsed in water followed by drying in nitrogen. Subsequently, 50 Å of electron beamed titanium and 600 Å of gold were vacuum evaporated from an electron-beam and resistive-heater source respectively. The patterning of the gate metal layer was completed by lift-off of the metal in acetone followed by a methanol and water rinse.

The gate dielectric, 1600 Å $SiO_2$, was sputtered (450 W on an 8 inch diameter $SiO_2$ target). Next, 500 Å of ZnO (100 W on a 6 inch ZnO target, 10% $O_2$ in Ar flow at 0.4 sccm) was sputtered The ZnO was etched photolithographically as follows. Positive photoresist (FUTURREX PR1-1000A) was applied to the substrate by spin coating at 5000 RPM for 60 seconds followed by a soft bake at 120° C. for 120 seconds. The resist was exposed at 120 mJ/cm² through a photolithography mask The resist was developed by exposure to FUTURREX RD6 developer for 40 seconds. The sample was then inspected, rinsed with water and dried with nitrogen. The substrate was then etched in 0.5% HCl for 6 seconds and the photoresist was then removed.

The $SiO_2$ was etched as follows. The ZnO-etched substrate was prebaked at 120° C. for 60 seconds. Positive photoresist was applied to the prebaked substrate (FUTURREX PR1-1000A spin coated at 5000 RPM for 60 seconds followed by a soft bake at 120° C. for 120 seconds. The resist was exposed through a photolithography mask with 120 mJ/cm², developed using FUTURREX RD6 developer, inspected, rinsed in water and then dried with nitrogen. The substrate was then hard baked at 120° C. for 60 seconds. The sample was etched with PAD ETCH 4 (available from Ashland Specialty Chemicals, Dublin, Ohio) for 90 seconds followed by removal of the photoresist.

The source and drain electrodes were patterned by photolithography as follows. The etched oxide substrate was prebaked at 120° C. for 60 seconds. A layer of negative photoresist (FUTURREX NR7-1000PY) was applied by spin-coating at 5000 RPM for 60 seconds followed by a soft bake at 150° C. for 60 seconds. The photoresist was exposed through a source/drain aperture mask at 180 mJ/cm², post baked at 100° C. for 60 seconds, developed using FUTURREX RD6 for 10seconds, inspected, water rinsed and dried in nitrogen. Finally Ti/Au/Ag was sequentially deposited on top of the substrate. The patterning of the source/drain metal layer was completed by lift-off of the deposited metals in acetone followed by a rinse in methanol and water, and nitrogen blow-dry.

The encapsulant was applied as follows. A negative, epoxy-type photoresist (SU-8-2000.5, available from MicroChem, Newton, Mass.) was filtered through a 0.45 μm filter and then applied to the integrated TFT substrate by spin-coating at 5000 RPM for 60 seconds followed by a soft bake at 100° C. for 2 minutes. The sample was exposed through a photomask with an illumination of 54 mJ/cm² followed by a post exposure bake at 100° C. for 2 minutes. The sample was developed in SU-8 DEVELOPER (MicroChem) for 10 seconds followed by rinsing with isopropanol. The sample was hard baked at 150° C. for 2 minutes. The integrated TFT circuitry was complete at this point and ready for the OLED components.

The OLED stack was deposited on top of the encapsulating layer by vacuum evaporating 3000 Å 4,4',4"-tris(N-(3-methylphenyl)-N-phenylamine)triphenylamine (MTDATA) doped with 3% fluorinated tetracyanoquinodimethane (TCNQ), followed by 400 Å N,N'-Bis(naphthalen-1-yl)-N,N'-bis(phenyl)benzidine (NPB), 300 Å tris-(8-hydroxyquinoline) aluminum (Alq$_3$) doped with 10-(2-benzothiazolyl)-1,1,7,7-tetramethyl-2,3,6,7-tetrahydro-1H,5H,11-one (C545T), 200 Å Alq$_3$, 7 Å LiF (deposited at a rate of 0.5 Å/sec), 50 Å Al, and finally 150 Å of Ag.

While the invention has been particularly shown and described with reference to various embodiments thereof, it will be understood by those skilled in the art that various other changes in the form and details may be made therein without departing from the spirit and scope of the invention.

What is claimed is:

1. A display, comprising:
    a backplane substrate;
    a set of thin film transistor row and column drivers that is patterned on the backplane substrate and that contains ZnO channels;
    a set of pixel thin film transistors that is monolithically integrated with the set of thin film transistor row and column drivers on the backplane substrate and that contain ZnO channels; and
    a set of organic light-emitting diodes comprising a stack of layers patterned on the backplane substrate, wherein each organic light-emitting diode is activated to produce light by a corresponding one or more pixel thin film transistors of the set, and wherein the corresponding one or more pixel thin film transistors are addressed by the set of thin film transistor row and column drivers.

2. The display of claim 1, wherein the backplane substrate is flexible.

3. The display of claim 2, wherein the backplane substrate is plastic.

4. The display of claim 1, wherein the backplane substrate is rigid.

5. The display of claim 4, wherein the backplane substrate is glass.

6. The display of claim 1, wherein the set of thin film transistor row and column drivers and the set of pixel thin film transistors are patterned by photolithography and at least one layer of the stack of layers in the the set of organic light-emitting diodes is patterned by polymeric aperture masking.

7. The display of claim 1, wherein the set of thin film transistor row and column drivers, the set of pixel thin film transistors, and at least one layer of the stack of layers in the set of organic light-emitting diodes are patterned by polymeric aperture masking.

8. The display of claim 1, wherein the organic light emitting diodes emit away from the backplane substrate.

9. The display of claim 1, wherein the organic light emitting diodes emit through the backplane substrate.

10. The display of claim 1, wherein the set of pixel thin film transistors form individual cells that contain four thin film transistors and one organic light-emitting diode per cell.

11. The display of claim 1, wherein the thin film transistor row and column drivers have an electron mobility in excess of 4 cm$^2$/V-sec.

12. A method of creating a display, comprising:
    patterning a set of ZnO channel thin film transistor row and column drivers on a backplane substrate;
    patterning a set of ZnO channel pixel thin film transistors on the backplane substrate, the pixel thin film transistors being in electrical connection with the thin film transistor row and column drivers; and
    patterning a set of organic-light emitting diodes on the backplane substrate in electrical connection with the pixel thin film transistors, wherein each organic light-emitting diode comprises a stack of layers.

13. The method of claim 12, wherein patterning the set of ZnO channel thin film transistor row and column drivers and patterning the set of ZnO channel pixel thin film transistors on the backplane substrate comprises forming by photolithography.

14. The method of claim 12, wherein patterning the set of ZnO channel thin film transistor row and column drivers and patterning the set of ZnO channel pixel thin film transistors on the backplane substrate comprises utilizing polymeric aperture masking.

15. The method of claim 12, wherein patterning the set of organic light-emitting diodes on the backplane substrate comprises forming at least one layer of the stack of layers in the organic light-emitting diodes utilizing polymeric aperture masking.

16. A method of creating a video display backplane, comprising:
    utilizing polymeric aperture masking to define ZnO channel row and column drivers and ZnO channel pixel thin film transistors on a backplane substrate; and
    utilizing polymeric aperture masking to define organic light-emitting diodes on the backplane substrate.

17. The method of claim 16, wherein utilizing polymeric aperture masking to define ZnO channel row and column drivers and ZnO channel pixel thin film transistors comprises patterning electrical connections between the row and column drivers and the pixel thin film transistors.

18. The method of claim 16, wherein utilizing polymeric aperture masking to pattern organic-light emitting diodes on the backplane substrate comprises patterning electrical connections between the pixel thin film transistors and the organic light-emitting diodes.

19. The method of claim 16, wherein utilizing polymeric aperture masking to define organic-light emitting diodes on the backplane substrate comprises patterning layers forming the organic light-emitting diodes atop an electrode layer of the pixel thin film transistors.

20. The method of claim 16, further comprising patterning an encapsulant layer over the row and column drivers and the pixel thin film transistors.

* * * * *

UNITED STATES PATENT AND TRADEMARK OFFICE
CERTIFICATE OF CORRECTION

PATENT NO. : 7,298,084 B2  
APPLICATION NO. : 10/979067  
DATED : November 20, 2007  
INVENTOR(S) : Paul F. Baude It is certified that error appears in the above-identified patent and that said Letters Patent is hereby corrected as shown below:

Under item (56) References Cited  
Page 2, Column 1 (Other Publications)  
Line 14, delete "a Si:H" and insert in place thereof -- a-Si:H --.

Page 2, Column 2 (Other Publications)  
Line 25, delete "scienc" and insert in place thereof -- Science --.

Column 1  
Line 35 (approx.), delete "(TFFs)" and insert in place thereof -- TFTs --.

Line 40 (approx.), delete "TF Is" and insert in place thereof -- TFTs --.

Column 2  
Line 19 (approx.), delete "TFFs" and insert in place thereof -- TFTs --.

Column 5  
Line 8, delete "(e.g," and insert in place thereof -- (e.g., --.

Column 7  
Line 13, delete "EEEE" and insert in place thereof -- IEEE --.

Column 9  
Line 52, delete "200 |" and insert in place thereof -- 200 Å --.

Column 10  
Line 43, delete 10seconds," and insert in place thereof -- 10 seconds, --.

UNITED STATES PATENT AND TRADEMARK OFFICE
CERTIFICATE OF CORRECTION

PATENT NO. : 7,298,084 B2
APPLICATION NO. : 10/979067
DATED : November 20, 2007
INVENTOR(S) : Paul F. Baude It is certified that error appears in the above-identified patent and that said Letters Patent is hereby corrected as shown below:

<u>Column 11</u>
Line 3, after "11" insert -- H benzopyrano (6,7,8-ij) quinolizin-11 --.

Line 40, in claim 6, before "set of" delete "the".

Signed and Sealed this

Sixth Day of May, 2008

JON W. DUDAS
*Director of the United States Patent and Trademark Office*